US008234603B2

United States Patent
Bagheri et al.

(10) Patent No.: US 8,234,603 B2
(45) Date of Patent: Jul. 31, 2012

(54) METHOD FOR FAST ESTIMATION OF LITHOGRAPHIC BINDING PATTERNS IN AN INTEGRATED CIRCUIT LAYOUT

(75) Inventors: Saeed Bagheri, Croton on Hudson, NY (US); David L. DeMaris, Austin, TX (US); Maria Gabrani, Thalwil (CH); David Osmond Melville, New York, NY (US); Alan E. Rosenbluth, Yorktown Heights, NY (US); Kehan Tian, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 12/835,891

(22) Filed: Jul. 14, 2010

(65) Prior Publication Data
US 2012/0017194 A1 Jan. 19, 2012

(51) Int. Cl.
*G06F 17/50* (2006.01)
(52) U.S. Cl. ........ 716/56; 716/50; 716/51; 716/52; 716/53; 716/54
(58) Field of Classification Search .......... 716/50–56
See application file for complete search history.

(56) References Cited

U.S. PATENT DOCUMENTS

| | | | |
|---|---|---|---|
| 6,563,566 B2 | 5/2003 | Rosenbluth et al. | |
| 7,069,535 B2 * | 6/2006 | Kobozeva et al. | 716/53 |
| 7,254,251 B2 * | 8/2007 | Cai et al. | 382/100 |
| 7,565,633 B2 | 7/2009 | Mukherjee et al. | |

(Continued)

FOREIGN PATENT DOCUMENTS

JP 2009-092779 A 4/2009

OTHER PUBLICATIONS

Chua et al., "Modified Rayleigh criterion for 90 nm lithography technologies and below," Microelectronic Engineering, vol. 71, pp. 139-149 (2004).

(Continued)

*Primary Examiner* — Paul Dinh
*Assistant Examiner* — Nha Nguyen
(74) *Attorney, Agent, or Firm* — Scully, Scott, Murphy & Presser, P.C.; Wenjie Li

(57) ABSTRACT

The present invention provides a lithographic difficulty metric that is a function of an energy ratio factor that includes a ratio of hard-to-print energy to easy-to-print energy of the diffraction orders along an angular coordinate $\theta_i$ of spatial frequency space, an energy entropy factor comprising energy entropy of said diffraction orders along said angular coordinate $\theta_i$, a phase entropy factor comprising phase entropy of said diffraction orders along said angular coordinate $\theta_i$, and a total energy entropy factor comprising total energy entropy of said diffraction orders. The hard-to-print energy includes energy of the diffraction orders at values of the normalized radial coordinates r of spatial frequency space in a neighborhood of r=0 and in a neighborhood of r=1, and the easy-to-print energy includes energy of the diffraction orders located at intermediate values of normalized radial coordinates r between the neighborhood of r=0 and the neighborhood of r=1. The value of the lithographic difficulty metric may be used to identify patterns in a design layout that are binding patterns in an optimization computation. The lithographic difficulty metric may be used to design integrated circuits that have good, relatively easy-to-print characteristics.

25 Claims, 14 Drawing Sheets

U.S. PATENT DOCUMENTS

| | | | | |
|---|---|---|---|---|
| 7,684,013 | B2* | 3/2010 | Hansen et al. | 355/67 |
| 7,840,917 | B2* | 11/2010 | Bae et al. | 716/102 |
| 7,981,576 | B2* | 7/2011 | Hsu et al. | 430/5 |
| 2003/0154460 | A1 | 8/2003 | Taoka et al. | |
| 2007/0094634 | A1 | 4/2007 | Seizginer et al. | |
| 2009/0217224 | A1 | 8/2009 | Wiaux et al. | |
| 2010/0131909 | A1 | 5/2010 | Miloslavsky et al. | |
| 2010/0151364 | A1* | 6/2010 | Ye et al. | 430/5 |

OTHER PUBLICATIONS

Schulze et al., "Statistical data assessment for optimization of the data preparation and manufacturing," Design and Process Integration for Microelectronics Manufacturing II, Alexander Starikov, Editor, Proc. of SPIE, vol. 5042 pp. 286-292 (2003).

Yenikaya et al., "A rigorous method to determine printability of a target layout," Design for Manufacturability through Design-Process Integration, edited by Alfred K. K. Wong, Vivek K. Singh, Proc. of SPIE, vol. 6521, pp. 652112-1-652112-12, (2007).

Yu et al., "Fast Predictive Post-OPC Contact/Via Printability Metric and Validation," Optical Microlithography XX, edited by Donis G. Flagello, Proc. of SPIE vol. 6520, pp. 652045-1-652045-10 (2007).

Wang et al., "Illustration of Illumination Effects on Proximity, Focus Spillover, and Design Rules," Design for Manufacturability through Design-Process Integration III, edited by Vivek K. Singh, Michael L. Rieger, Proc. of SPIE vol. 7275, pp. 72750B-1-72750B-10 (2009).

Neureuther et al., "No-fault assurance: linking fast process CAD and EDA," 22nd Annual BACUS Symposium on Photomask Technology, Brian J. Grenon, Kurt R. Kimmel, Editors, Proc. of SPIE vol. 4889, pp. 871-878 (2002).

International Search Report and Written Opinion dated Feb. 24, 2012 issued in corresponding International Application No. PCT/US2011/042991.

* cited by examiner

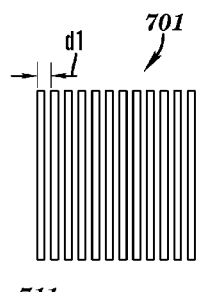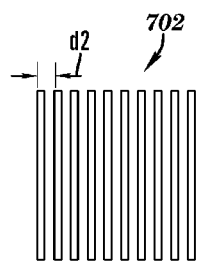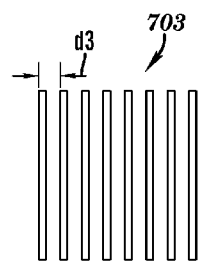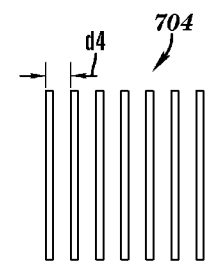
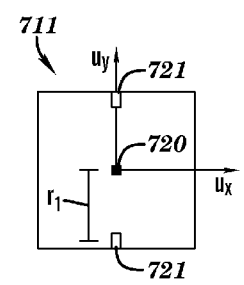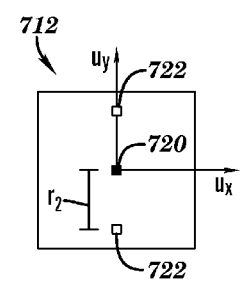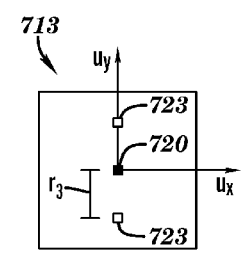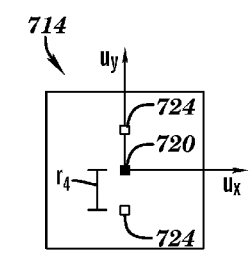
*FIG. 7A*     *FIG. 7B*     *FIG. 7C*     *FIG. 7D*

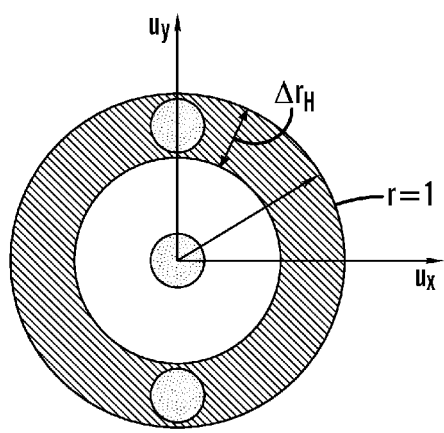 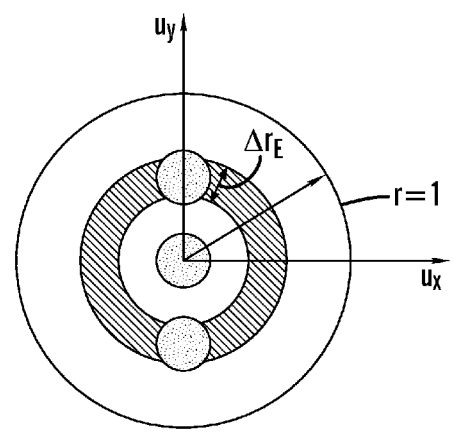
*FIG. 8A*     *FIG. 8B*

METHOD FOR FAST ESTIMATION OF LITHOGRAPHIC BINDING PATTERNS IN AN INTEGRATED CIRCUIT LAYOUT

FIELD OF THE INVENTION

The present invention broadly relates to lithographic printing of features for forming integrated circuit (IC) patterns on a semiconductor chip, and particularly to improvements in selecting and using combinations of illumination source characteristics and diffracting shapes on a reticle mask, and more particularly to improvements in identifying and prioritizing portions of an IC design on which to perform optimization of the lithographic process more cost effectively.

BACKGROUND

In the manufacture of integrated circuits, photolithographic processes are commonly used, in which a wafer is patterned by projecting radiation through a patterned mask to form an image pattern on a photo sensitive material, referred to as a photoresist, or simply resist. The exposed resist material is developed to form openings corresponding to the image pattern, and then the pattern is transferred to the wafer substrate by methods such as etching, as known in the art.

Many methods have been developed to compensate for the image degradation that occurs when the resolution of optical lithography systems approaches the critical dimensions (CD's) of desired lithographic patterns that are used to form devices and integrated circuits (IC's) on a semiconductor chip. Critical dimension (CD) refers to the feature size and spacing between features and feature repeats (pitch) that are required by the design specifications and are critical for the proper functioning of the devices on a chip. When the CD's of a desired IC pattern approach the resolution of a lithographic system (defined as the smallest dimensions that can be reliably printed by the system), image distortions becomes a significant problem. Today the limited resolution of lithography tools poses a key technical challenge in IC manufacture, and this difficulty will increase in the future as critical dimensions become increasingly smaller. In order to make the manufacture of future IC products feasible, lithography tools will be required to achieve adequate image fidelity when the ratio of minimum CD to resolution of the lithographic system is very low.

The basic lithography system consists of a light source, a photomask containing the pattern to be transferred to the wafer, a collection of lenses, and a means for aligning existing patterns on the wafer with patterns on the mask. The mask design process as described herein covers the steps from chip design, model-based optical proximity correction (MBOPC), OPC Verification and mask fabrication.

The resolution $\rho$ of a lithographic system can be described by the equation:

$$\rho = k_1 \frac{\lambda}{NA}, \qquad \text{Eq. 1}$$

where $\rho$ is the minimum feature size that can be lithographically printed, $\lambda$ is the wavelength of the light source used in the projection system and NA (numerical aperture) is a measure of the amount of light that can be collected by the projection optics. $k_1$ is a factor that represents aspects of the lithographic process other than wavelength or numerical aperture, such as resist properties or the use of enhanced masks. When the illumination source is partially coherent, $k_1$ may expressed as $1/[2(\sigma+1)]$, where $\sigma$ is a measure of the partial coherence of the source, where $\sigma$ has a value between 0 and 1. Typical values for $k_1$ range from about 0.7 to 0.3.

Low $k_1$ patterning is typically extremely sensitive to fluctuations in lithographic parameters such as dose, mask CD, focus, etc., which leads to small process windows. Methods have been proposed for optimizing combinations of source illumination and mask patterns (referred to hereinafter as source-mask optimization or "SMO") together can result in improved process windows (see, for example, U.S. Pat. No. 6,563,566). However, SMO methods are very computationally expensive and it is impractical to perform SMO on a full chip layout. Thus, only selected "hard-to-print" patterns from the full chip layout should be considered for full optimization by computationally intensive methods such as SMO.

Currently, so-called "hard-to-print" patterns are identified using a set of predetermined rules that are determined experimentally for a specific chip design. However, such rules are not applicable in general cases. Other methods rely on an approximate imaging methods that are too slow for many applications.

In view of the above, there is a need for a fast method to identify "hard-to-print" patterns that can be prioritized for processing with full optimization methods.

SUMMARY OF THE INVENTION

The present invention provides a method and computer program product for designing an integrated circuit layout, comprising the steps of providing a plurality of layouts of features to be printed, determining the diffraction orders in spatial frequency space for each of the plurality of layouts, providing a lithographic difficulty metric, computing, for each of the plurality of layouts, values of the lithographic difficulty metric, and evaluating each of the plurality of layouts based on the values of the lithographic difficulty metric.

The inventive lithographic difficulty metric is a function of an energy ratio factor comprising a ratio of hard-to-print energy to easy-to-print energy of said diffraction orders along an angular coordinate $\theta_i$ of spatial frequency space, wherein the hard-to-print energy comprises energy of the diffraction orders at values of the normalized radial coordinates r of spatial frequency space in a neighborhood of r=0 and in a neighborhood of r=1, and the easy-to-print energy comprises energy of the diffraction orders located at intermediate values of the normalized radial coordinates r between the neighborhood of r=0 and the neighborhood of r=1, an energy entropy factor comprising energy entropy of the diffraction orders along the angular coordinate $\theta_i$, a phase entropy factor comprising phase entropy of the diffraction orders along the angular coordinate and $\theta_i$; and a total energy entropy factor comprising total energy entropy of the diffraction orders.

According to one aspect of the invention, the method further comprises performing full optimization processing on each of the plurality of layouts having a value of the lithographic difficulty metric that is greater than a predetermined lithographic difficulty threshold.

According to another aspect of the invention, the plurality of layouts comprises a set of unique tiles of patterns of features such that a full chip layout consists of an arrangement of a plurality of tiles selected from the set of unique tiles.

The predetermined lithographic difficulty threshold may be typically set to identify which of the unique tiles in said set of unique tiles are binding patterns of the full chip layout.

According to yet another aspect of the invention, the computed values of the lithographic difficulty metric are computed at selected values of the angular coordinate $\theta_j$, and the method further comprises determining a global lithographic difficulty metric for each of the plurality of layouts, the global lithographic difficulty metric comprising a maximum value of the lithographic difficulty metrics from among the selected values of the angular coordinate $\theta_j$.

In another aspect, a method of designing an integrated circuit layout is provided, comprising the steps of: providing a set of design tiles, wherein each of the design tiles in the set comprises a unique layout of patterns of features to be printed; providing a plurality of chip layouts, wherein each of the chip layouts consists of an arrangement of tiles selected from the set of design tiles; providing a lithographic difficulty metric. The method further includes, for each of the chip layouts, performing the method steps of: determining the diffraction orders in spatial frequency space for each unique tile in the arrangement of tiles; computing, for each of the unique tiles in the arrangement of tiles, values of the lithographic difficulty metric; evaluating each of the unique tiles based on the values of the lithographic difficulty metric.

The method according to the invention may be implemented in a computer program product and a computer system comprising a computer useable medium including computer readable instructions, wherein the computer readable instructions, when executed on a computer causes the computer or computer system to perform the method steps of providing a plurality of layouts of features to be printed, determining the diffraction orders in spatial frequency space for each of the plurality of layouts, providing a lithographic difficulty metric, computing, for each of the plurality of layouts, values of the lithographic difficulty metric, and evaluating each of the plurality of layouts based on the values of said lithographic difficulty metric.

The foregoing and other features and advantages of the invention will be apparent from the following detailed description of the invention.

BRIEF DESCRIPTION OF THE DRAWINGS

Referring to the exemplary drawings wherein like elements are numbered alike in the several figures, not necessarily drawn to scale, in which:

FIGS. 7A-7D illustrate examples of grating patterns of varying pitch and corresponding plots of diffraction order amplitudes in spatial frequency space or direction space.

FIG. 8A illustrates a schematic plot, in direction space, of energy of a relatively hard-to-print pattern.

FIG. 8B illustrates a schematic plot, in direction space, of energy of a relatively easy-to-print pattern.

DETAILED DESCRIPTION OF THE INVENTION

This invention presents a method and apparatus for designing and optimizing layouts for use in the manufacture of integrated circuits, and more particularly, for identifying and prioritizing portions of such layouts for which a full optimization methodology is to be performed.

Figure 1:
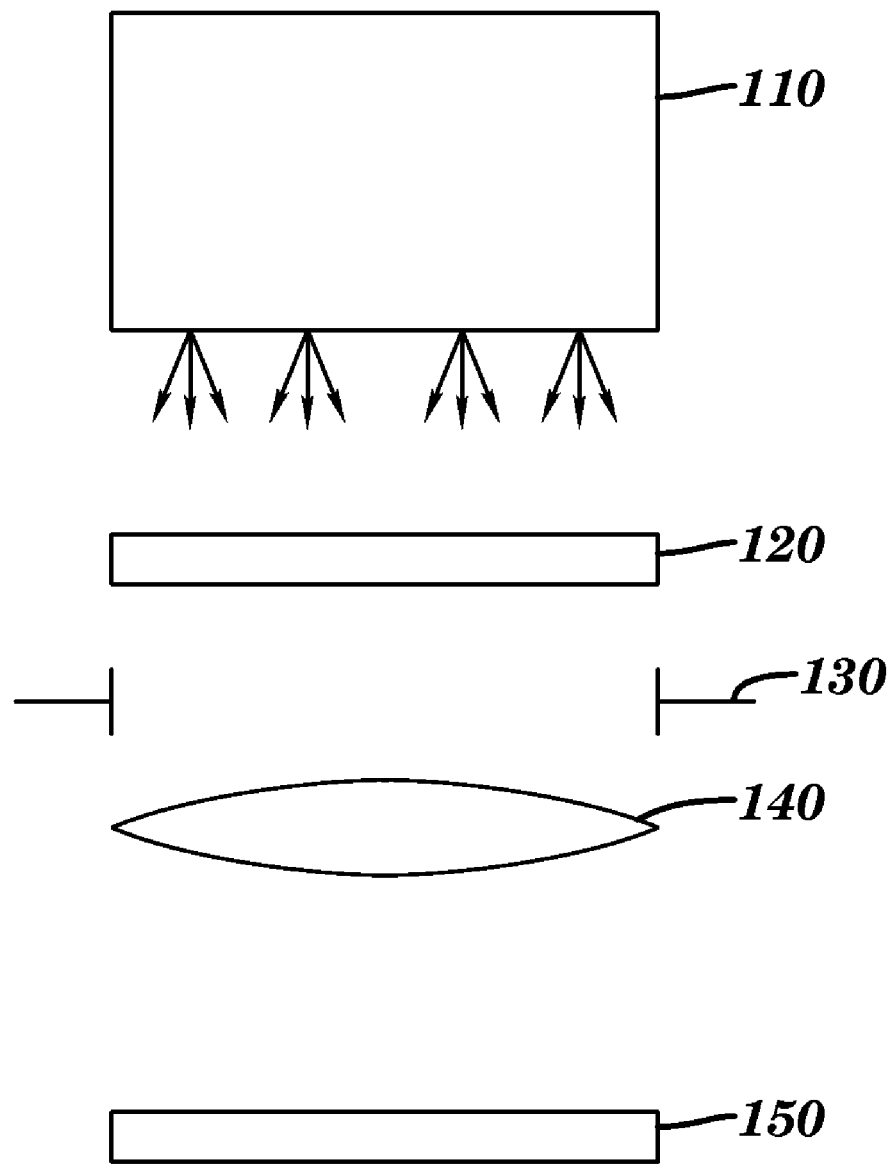
FIG. 1 illustrates a schematic of a conventional lithographic imaging system.

The basic components of a projection lithographic system are illustrated in FIG. 1. An illumination source 110 provides radiation that illuminates a mask 120, also known as a reticle; the terms mask and reticle may be used interchangeably. The reticle 120 includes features that act to diffract the illuminating radiation through a lens 140 which projects an image onto an image plane, for example, a semiconductor wafer 150. The aggregate amount of radiation transmitted from the reticle 120 to the lens 140 may be controlled by a pupil 130. The illumination source 110 may be capable of controlling various source parameters such as direction and intensity. The wafer 150 typically includes a photoactive material (known as a resist). When the resist is exposed to the projected image, the developed features closely conform to the desired pattern of features required for the desired IC circuit and devices.

The pattern of features on the reticle 120 acts as a diffracting structure analogous to a diffraction grating which transmits radiation patterns that may interfere constructively or destructively. This pattern of constructive and destructive interference can be conveniently described in terms of a Fourier transform in direction space (or equivalently also referred to herein as spatial frequency space) based on spacing of the features of the diffraction grating (or reticle 120). The Fourier components of diffracted energy associated with the spatial frequencies of the diffracting structure are known in the art as diffracted orders. For example, the zeroth order is associated with the direct current (DC) component, but higher orders are related to the wavelength of the illuminating radiation and inversely related to the spacing (known as pitch) between repeating diffracting features. When the pitch of features is smaller, the angle of diffraction is larger, so that higher diffracted orders will be diffracted at angles larger than the numerical aperture of the lens.

Figure 2:
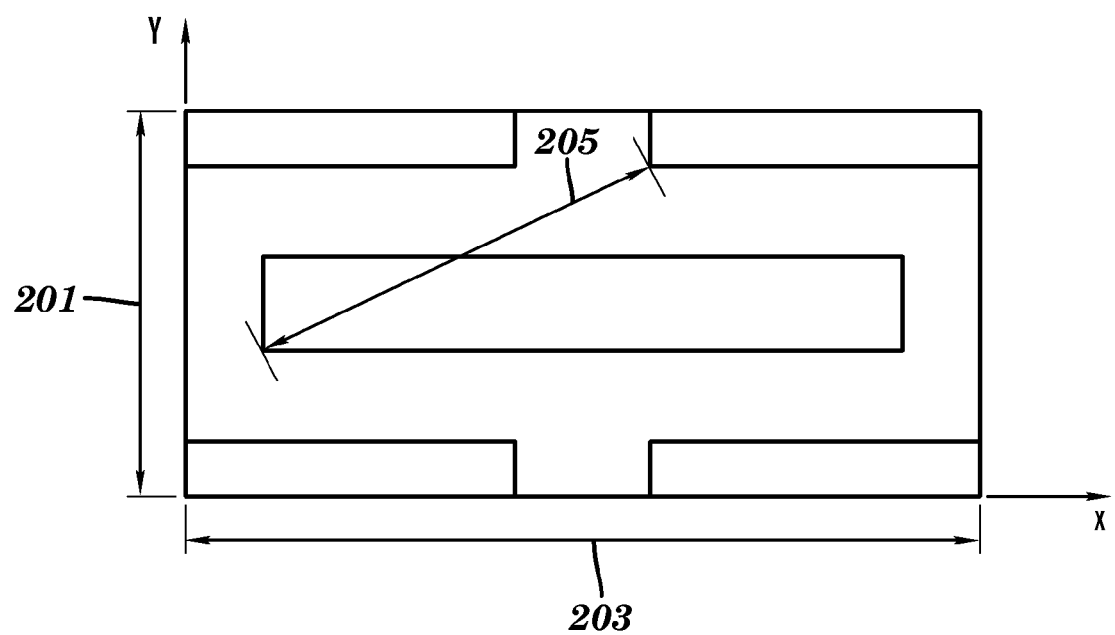
FIG. 2 illustrates an example of a unit cell of a repeating pattern to be printed.
Figure 3:
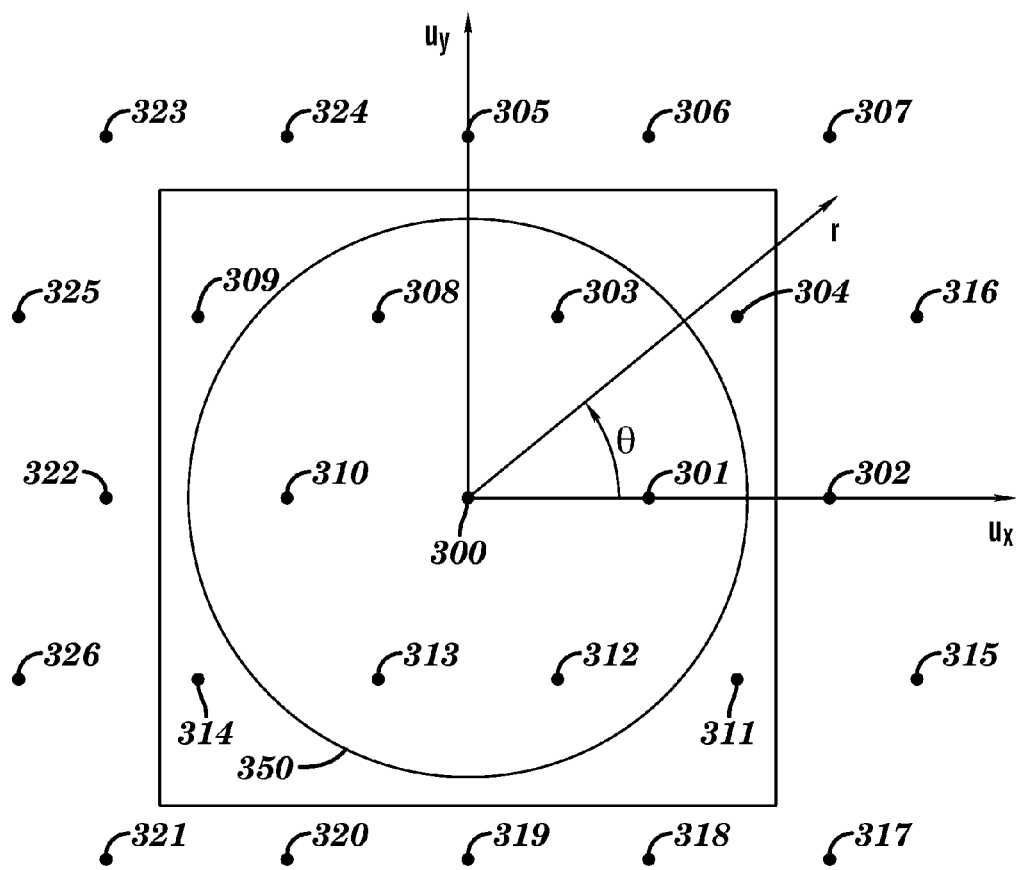
FIG. 3 illustrates a plot of diffraction orders in direction or spatial frequency space corresponding to the unit cell of FIG. 2.

A diagram can be constructed in direction space to indicate the diffracted orders that can be collected by a lithographic system that is based on repeating dimensions of a desired pattern. For example, consider a unit cell pattern illustrated in FIG. 2. The unit cell pattern has a dimension 203 that repeats in the horizontal direction x, and a staggered pitch indicated by the diagonal repeat dimension 205 (alternatively indicated by the pitch 201 in the vertical direction y). Assuming that this unit cell is repeated in a diffraction grating and illuminated by an on-axis beam, the Fourier transform of the diffraction grating are diffracted orders $a(u_x, u_y)$ which can be illustrated in spatial frequency space or direction space $(u_x, u_y)$ as indicated in FIG. 3. The position of a diffracted order (points 300-326) is plotted as the projection of the beam diffracted at an angle from the on-axis beam. The distance of a non-zero order from the center of the direction space diagram 300 (which represents the position of the zeroth order and is also the direction of the on-axis beam) is plotted as the sine of the angle from the on-axis beam, which is the ratio of the wavelength of the illumination divided by the repeat distance. For example, the +2 order represented by the horizontal repeat distance 203 is represented by the point 301 and the −2 order is represented by the point 310. Similarly, points 305 and 319 represent the +2 and −2 orders based on the vertical repeat distance 201. Other orders are diffracted both horizontally and vertically, such as order 308, denoted as the {−1, +1} order. The only orders collected by the lens are 300, 301, 310, 303, 308, 313, and 312 are those within the resolution limit 350 of the optical system. The radius r of the circle 350 is $r=\frac{1}{2}\rho=[(\sigma+1)NA]/\lambda$. Typically, the radius r is normalized, and, for ease of discussion, the circle 350 is referred to hereinafter as the unit circle. Note that the amplitudes of a wave front diffracted by a reticle will be dependent on both the illumination amplitude and the diffractive properties of the mask.

The diffraction orders $a(u_x, u_y)$ may also be represented in terms of radial coordinates in spatial frequency space, as in:

$$a(u_x, u_y) = a(r \angle \theta) \qquad \text{Eq. 2}$$

where r is the radial coordinate in direction space and $\theta$ is the angular coordinate in direction space.

A chip design layout typically contains millions of features, many of which are arranged in patterns that may be repeated throughout the chip layout. Although it may be desirable to perform an optimization of the entire chip as a single unit, a full optimization of the whole chip is not practical due to limitations such as computer memory, computation time and cost. For the purposes of optimization, it is useful to subdivide and classify the entire layout into a small, computationally practical number of unique patterns or "tiles" of features that, when assembled together, exhaustively represent the chip layout. Preferably, a minimum tile size contains a set of features such that a feature located at the edge of a tile is within the optical radius of influence (ROI) around a feature located at the center of the tile. The ROI is the distance at which a feature located outside the ROI would not substantially affect, within a predetermined variability tolerance, the printing of the target (e.g. center) feature. For example, the ROI may be set to be a region having a radius wherein a feature located outside the ROI would influence the printed size of a feature at the center of the tile by less than a variability tolerance of 5%. A maximum tile size is chosen according to practical limitations, such as memory, CPU or turnaround time requirements and cost. Any method now known or developed in the future may be used to identify such tiles. As discussed further below, many of the tiles may represent patterns that are repeated throughout the layout, so that an analysis, in accordance with the invention, of one such tile only needs to be performed once for the entire layout.

In accordance with the invention, a lithographic difficulty (equivalently referred to as "litho difficulty") metric LD is defined for a given tile j that provides a measure of the relative distribution of energy in relatively "hard-to-print" patterns versus relatively "easy-to-print" patterns within the jth tile. Furthemore, the litho difficulty metric is defined along a given angular coordinate $\theta_i$ of the unit circle in direction space, where for convenience, hereinafter, the index i equivalently refers to a given angular coordinate $\theta_i$. The litho difficulty metric $LD_i^j$ for the jth tile in the ith region is a function of four factors: 1) an energy ratio factor $A_i^j$ (see Eq. 3) representing a ratio of "hard" to print versus "easy" to print diffracted energy along an angular coordinate $\theta_i$ in spatial frequency space for the jth tile; 2) an energy entropy factor $B_{e,i}^j$ (see Eq. 4) representing a (typically normalized) measure of energy entropy along an angular coordinate $\theta_i$ in spatial frequency space for jth tile; 3) a phase entropy factor $B_{\phi,i}^j$ (see Eq. 5) representing a measure of phase entropy along an angular coordinate $\theta_i$ in spatial frequency space for the jth tile; and 4) a total energy entropy factor $E_T^j$ (see Eq. 6) representing a measure of the total energy entropy for the jth tile.

The energy ratio factor $A_i^j$ is defined as $$A_i^j = \frac{\int_{r=0}^i W_i^j(r) f_{MH}(r) dr}{\int_{r=0}^i W_i^j(r) f_{NH}(r) dr}, \qquad \text{Eq. 3}$$

where $W_i^j(r)$ is an amplitude factor proportional to the energy of the diffraction orders along a given angular coordinate $\theta_i$ in direction space, $f_{IMH}(r)$ is a "hard-to-print" difficulty filter that weights towards "hard-to-print" diffracted energy along the ith angular direction, and $f_{MH}(r)$ is an "easy-to-print" difficulty filter that weights towards "easy-to-print" diffracted energy along the ith angular direction, as further described below.

The (normalized) energy entropy factor $B_{e,i}^j$, is a measure of the energy entropy for the jth tile along the ith angular coordinate, and can be expressed as $$B_{e,i}^j = \int_0^i p_{e,i}^j(e) \log [p_{e,i}^j(e)] de, \qquad \text{Eq. 4}$$

where $p_{e,i}^j(e)$ is a distribution function of energy values of the diffraction orders $a_j(u_x, u_y)$ along the ith angular direction $\theta_i$.

The phase entropy factor, $B_{\phi,i}^j$, represents the distribution of phase $\phi$ of the diffraction orders $a_j(u_x, u_y)$ along the ith angular direction $\theta_i$, and can be expressed as:

$$B_{\phi,i}^j = \int_{\phi=0}^{2\pi} p_{\phi,i}^j(\phi) \log [p_{\phi,i}^j(\phi)] d\phi. \qquad \text{Eq. 5}$$

where $p_{\phi,i}^j(\phi)$ is a distribution function of phase values $\phi$ of the diffraction orders $a_j(u_x, u_y)$ of the jth tile along the ith angular direction $\theta_i$.

The total energy entropy factor, $E_T^j$, represents the (normalized) total energy entropy of the diffraction orders $a_j(u_x, u_y)$ for tile j and can be expressed as:

$$E_T^j = \int_{e=0}^1 p_e^j(e) \log [p_e^j(e)] de, \qquad \text{Eq. 6}$$

Where $p_e^j(e)$ is a distribution function of total energy entropy of the diffraction orders $a_j(u_x, u_y)$ of the jth tile.

In a preferred embodiment, a lithographic (or "litho") difficulty metric $LD_i^j$ of the ith region for the jth tile is expressed as:

$$LD_i^j = (W_T^j)^\alpha (A_i^j)^{[(B_{e,i}^j B_{\phi,i}^j E_T^j)^\beta]}, \qquad \text{Eq. 7}$$

where, for a given jth tile, $W_T^j$ is the total energy of the diffracted orders which may be expressed as an integral over the unit circle:

$$W_T^j = \int_{r=0}^1 \int_{\theta=0}^{2\pi} |a_j(r \angle \theta)|^2 r dr d\theta, \qquad \text{Eq. 8}$$

$A_i^j$ (see Eq. 3) is a energy ratio factor along the angular coordinate i, $B_{e,i}^j$ (see Eq. 4) is a (normalized) energy entropy factor representing energy distribution of the diffracted orders along angular coordinate i, $B_{\phi,i}^j$ (see Eq. 5) is a phase entropy factor representing distribution of phase $\phi$ the diffracted orders along angular coordinate i, $E_T^j$ (see Eq. 6) is a total energy entropy factor representing total entropy of the diffracted orders, and $\alpha$ and $\beta$ are experimentally determined constants which may be calibrated based on patterns having known difficulty characteristics. The inventors have found that the constant $\alpha$ may be typically in the range 0.1-0.3, and the constant $\beta$ may be typically in the range of 0.002-0.01.

In accordance with the invention, the litho difficulty metric $LD_i^j$ is used to identify patterns or tiles that are binding patterns during an optimization of an entire chip layout, during an optimization procedure such as SMO. Binding patterns or tiles are those patterns or tiles that have active constraints during optimization of the chip layout.

Figure 4:
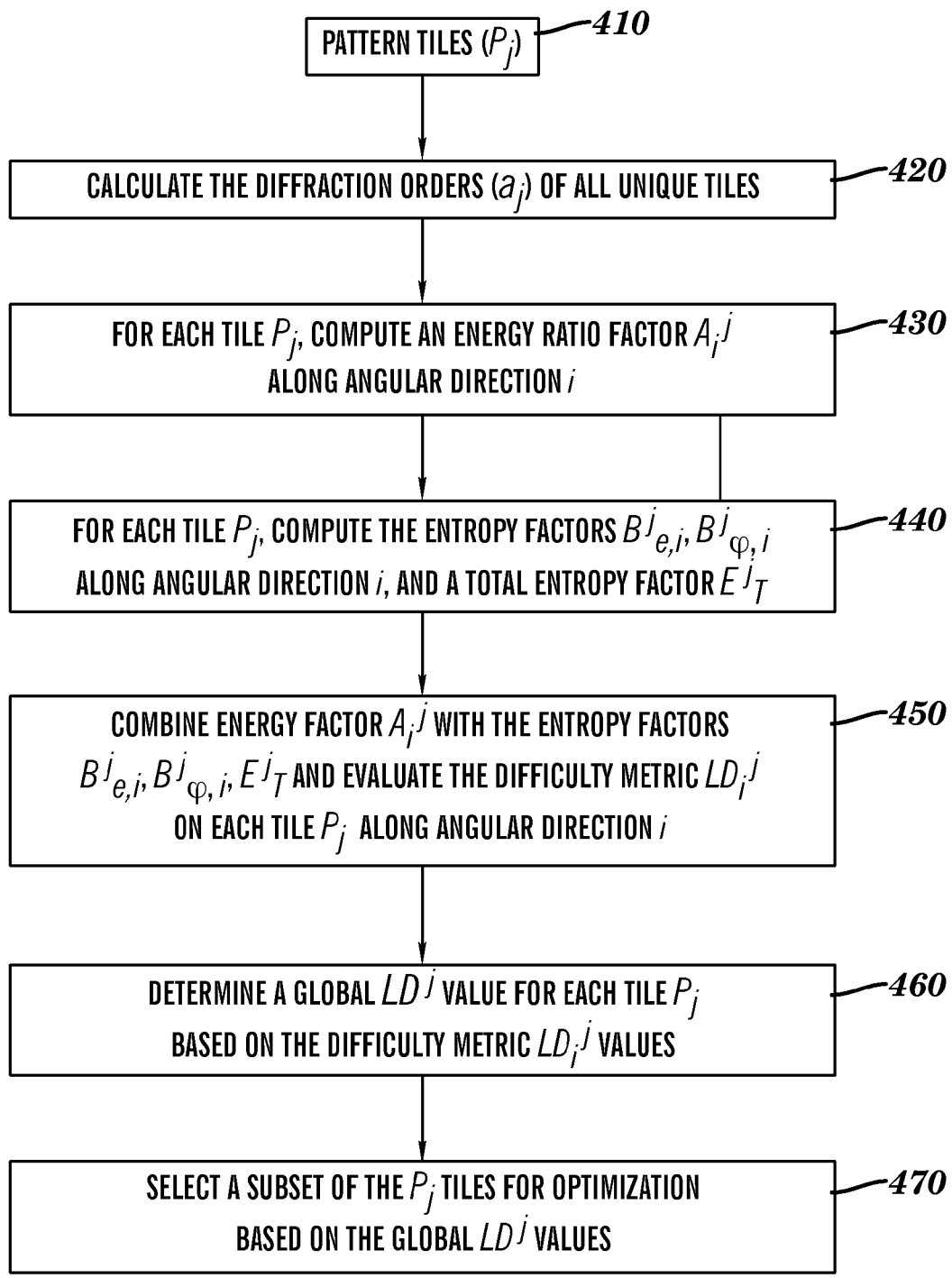
FIG. 4 illustrates an embodiment of a method in accordance with the invention.
Figure 5:
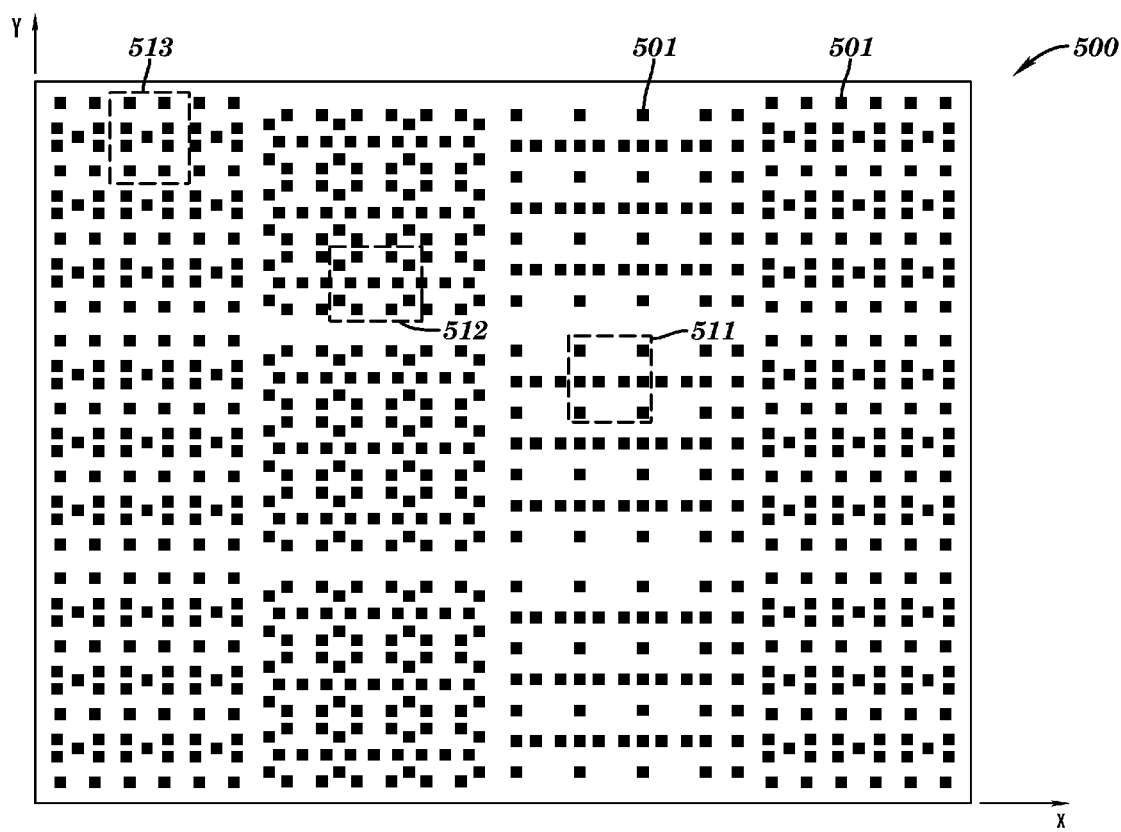
FIG. 5 illustrates a schematic of a portion of a design layout.

One embodiment of a method in accordance with the invention, is illustrated in FIG. 4. First, a chip layout of interest is provided and subdivided into a finite number of computationally practical set of unique unit cells or tiles (Block 410). Referring to FIG. 5, a portion of a chip layout 500 comprises a large number of individual features 501 to be printed. In the example illustrated in FIG. 5, the individual features 501 represent contact holes on a layer 500 of a chip design. However, features 501 could include, but are not limited to, any feature that may be used in the manufacture of an integrated circuit, such as polysilicon lines, implant regions, block masks, wiring patterns, vias, dummy fill, and the like. Typically, the chip layout 500 of features 501 may be subdivided into $J_{max}$ unique tiles $P_j$, j=1, ..., $J_{max}$ by any method now known or invented in the future. Many of the tiles $P_j$ 511, 512, 513 contain the smallest repeating unit cell of a pattern of features 501.

Next, in Block 420, the diffraction orders $a_j(u_x, u_y)$ are computed for each of the unique tiles $P_j(x, y)$, where $a_j(u_x, u_y)$ represents the Fourier transform, or equivalently, the diffraction order of the jth tile. Where multiple instances of the same jth tile $P_j$ are repeated throughout the layout of the chip, only one instance of $a_j$ needs to be computed for a given layout. Methods for computing the diffraction orders in direction (or equivalently spatial frequency) space from a Cartesian description of the feature polygons are known in the art.

Next, in accordance with the invention, (Block 430) a lithographic difficulty energy ratio factor $A_i^j$ (see Eq. 3) is computed for each jth tile along an angular coordinate $\theta_i$. The lithographic difficulty energy ratio factor $A_i^j$ is a representation of the relative amount of "hard-to-print" energy in the diffracted order $a_j$ of the jth tile.

Figure 6:
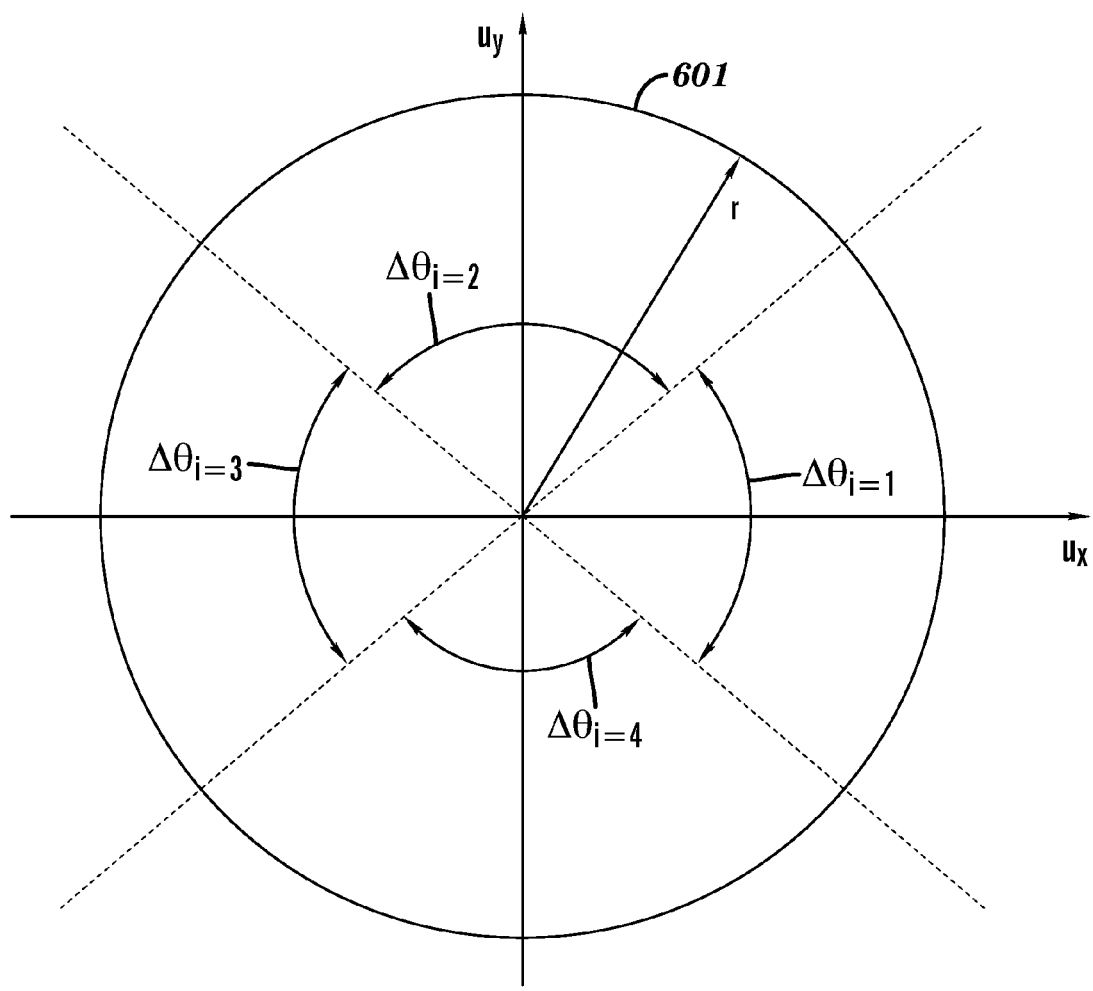
FIG. 6 illustrates a plot in spatial frequency or direction space in which the angular coordinate is divided into regions.

In a preferred embodiment, the unit circle in spatial frequency space $(r \angle \theta)$ is subdivided along the angular coordinate into $I_{max}$-radial regions $\Delta\theta_i$, $i \in \{1, 2, ..., I_{max}\}$. For example, in FIG. 6, the unit circle 601 (r=1) is divided into four radial regions, i.e. $I_{max}=4$. The regions $\Delta\theta_i$, $i \in \{1, 2, ..., I_{max}\}$, $I_{max}=4$, are defined as $\Delta\theta_1=\{q:-45°<\theta\leq 45°\}$, $\Delta\theta_2=\{q:45°<\theta\leq 135°\}$, $\Delta\theta_3=\{q:135°<\theta\leq 225°\}$, $\Delta\theta_4=\{q:225°<\theta\leq 315°\}$. The number of $I_{max}$ regions may be any number suitable for the accuracy and computational cost desired for a given application.

The amplitude factor $W_i^j(r)$ for the jth tile may then be computed for each ith radial region $\Delta\theta_i$ as $$W_{\Delta\theta_i}^j = \int_{\theta \in \Delta\theta_i}^{2\pi} |a_j(r\angle\theta)|^2 d\theta, \quad \text{Eq. 9}$$

In accordance with Eq. 3 and Eq. 9 above, one embodiment of the energy ratio factor $A_i^j$ may be computed for each region $\Delta\theta_i$ as:

$$A_{\Delta\theta_i}^j = \frac{\int_{r=0}^{i} W_{\Delta\theta_i}^j(r) f_{IMH}(r) dr}{\int_{r=0}^{i} W_{\Delta\theta_i}^j(r) f_{MH}(r) dr}, \quad \text{Eq. 10}$$

where $W_{\Delta\theta_i}^j(r)$ is an amplitude factor proportional to energy of the diffraction orders within a given region AO of the unit circle (see Eq. 9), $f_{IMH}(r)$ is a "hard-to-print" difficulty filter that weights towards "hard-to-print" diffracted energy, and $f_{MH}(r)$ is an "easy-to-print" difficulty filter that weights towards "easy-to-print" diffracted energy, as further described below.

The design of the difficulty filters $f_{IMH}(r)$, $f_{MH}(r)$, may be better understood with reference to FIGS. 7A-7D and 8. FIGS. 7A-7D illustrate grating patterns 701, 702, 703, 704 in order of increasing pitch d1<d2<d3<d4. The corresponding plots in direction space of the amplitudes of the diffracted orders are illustrated in 711, 712, 713, 714, respectively. It is known that as pitch increases, the relative difficulty of printing the grating will decrease. The energy of the zeroth order 720 at r=0 is present for each of the gratings. However, the location of the higher order energy peaks decrease as the pitch increases, that is, the pattern 701 that is the hardest to print has two energy 721 peaks located at r1. The pattern 702 that is relatively easier to print than pattern 701 (since d2>d1) has higher order energy peaks 722 located at r2 which is less than r1. Similarly, the higher order peaks 723 and the peaks 724 are located at radial positions r3, r4, respectively, that decrease as the printing difficulty of pattern decreases. In other words, as pitch increases d1<d2<d3<d4, and correspondingly as printing difficulty decreases, the higher order energy has radial location that decreases in direction space, i.e. r1>r2>r3>r4.

The printability of more complex two-dimensional patterns is not easily classified based on a visual inspection of the patterns. More generally, relatively hard to print patterns will have higher order diffracted energy located in regions of the unit circle that are in a range $\Delta r_H$ that is close to the edge of the unit circle r=1, as illustrated in FIG. 8A. Similarly, relatively easy to print patterns will have higher order energy located in regions of the unit circle that are in a range $\Delta r_E$ that is intermediate between r=0 and r=1, as illustrated in FIG. 8B.

Figure 9:
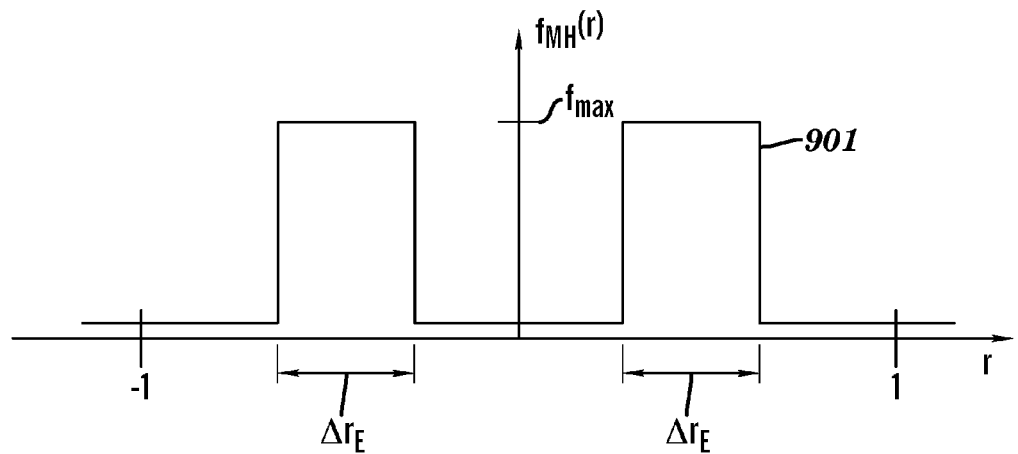
FIG. 9 illustrates a plot of an easy-to-print filter.

Thus, in accordance with the invention, an easy-to-print filter $f_{MH}(r)$ is provided to emphasize the higher order energy located in an intermediate range radial distances $\Delta r_E$ in direction space that are associated with relatively easy-to-print patterns. One embodiment of an intermediate range easy-to-print filter $f_{MH}(r)$ 901 is illustrated in FIG. 9. This easy-to-print filter has a step function maximum value $f_{max}$ located in the intermediate range radial distances $\Delta r_E$ and a minimum value outside of the radial distances $\Delta r_E$.

Figure 10:
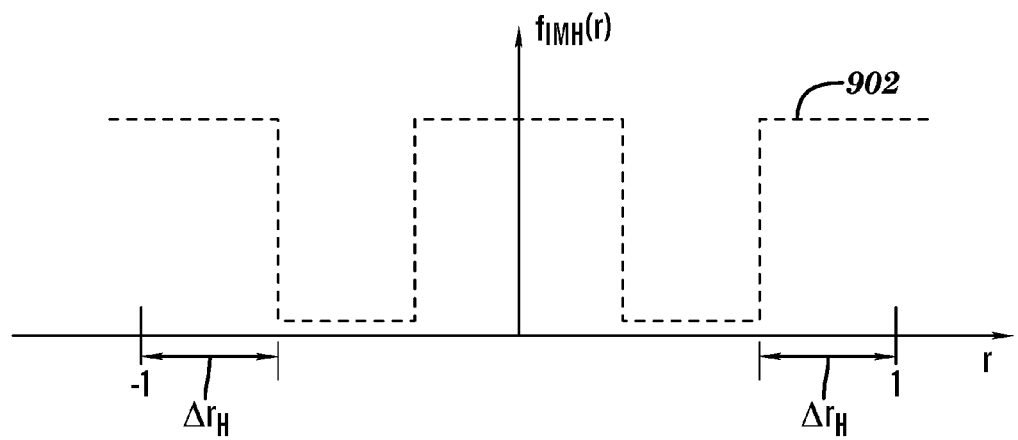
FIG. 10 illustrates a plot of a hard-to-print filter.

Similarly, a hard-to-print filter $f_{IMH}(r)$ is provided to emphasize the higher order energy located in range of radial distances $\Delta r_H$ in direction space that are associated with relatively hard-to-print patterns, i.e. having relatively high values of r. One embodiment of a hard-to-print filter $f_{IMH}(r)$ 902 is illustrated in FIG. 10. This hard-to-print filter 902 has a step function maximum value $f_{max}$ located in a range of radial distances $\Delta r_E$ that are close to the edge of the unit circle and also includes a step function having a maximum value $f_{max}$ at small values of r to include the zeroth order energy. The minimum value of the filter occurs in the intermediate radial distances between the radial distances $\Delta r_H$ and near small values of r.

Figure 11:
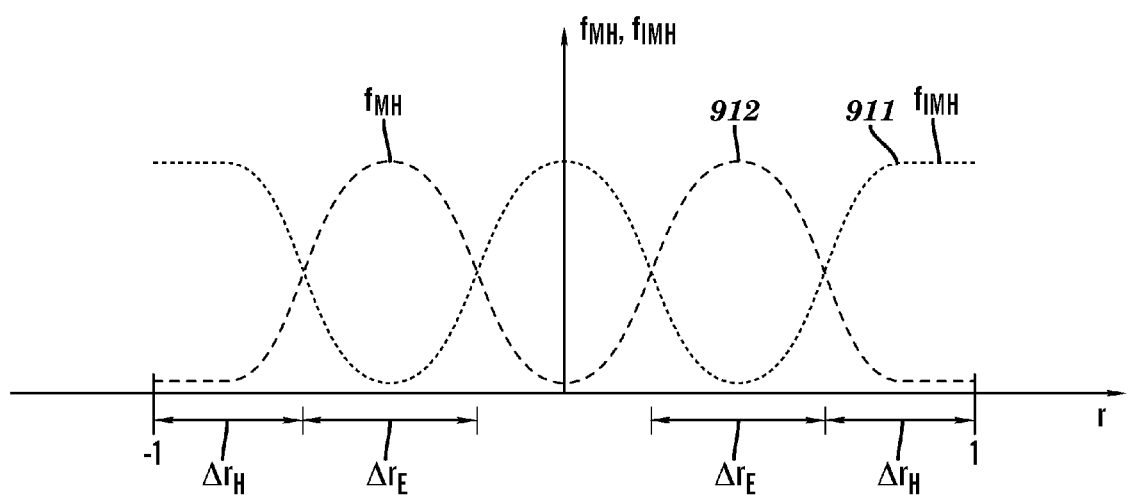
FIG. 11 illustrates another plot of examples of hard-to-print and easy-to-print filters.

More generally, difficulty filters $f_{IMH}(r)$, $f_{MH}(r)$ may be designed to have any suitable shape, as illustrated in FIG. 11. In this embodiment, an easy-to-print filter $f_{MH}(r)$ 912 is designed as a function that has peak values at intermediate range $\Delta r_E$ radial distances, referred to herein as a "mexican hat" function. Correspondingly, an embodiment of a hard-to-print filter $f_{IMH}(r)$ 911 has peak values at large radial distances $\Delta r_H$ and also at small values of r. This function is referred to herein as an "inverse mexican hat" function. The invention may be implemented using other suitable "hard" and "easy" difficulty filters that emphasize the hard-to-print energy ranges and easy-to-print energy ranges, respectively, and are not limited to the embodiments described herein.

Referring again to FIG. 4, in Block 430, in accordance with one embodiment, a value of the energy ratio factor $A_{\Delta\theta_i}^j$ is obtained for each unique jth tile $P_j$ within the angular region $\Delta\theta_i$.

Similarly, the entropy factors $B_{e,i}^j$, $B_{\phi,i}^j$, $E_T^j$ are computed in this embodiment in accordance with the following equations (Block 440).

The energy entropy factor, $B_{e,\Delta\theta_i}^j$, is a measure of the energy entropy of ith region of the jth tile and in this embodiment can be computed as $$B_{e,\Delta\theta_i}^j = \int_{\theta \in \Delta\theta_i} \int_0^i p_{e,\Delta\theta_i}^j(e) \log [p_{e,\Delta\theta_i}^j(e)] ded\theta, \qquad \text{Eq. 11}$$

Where $p_{e,\Delta\theta_i}^j(e)$ is a distribution function of energy values of the diffraction orders $a_j(u_x, u_y)$ within the angular region $\Delta\theta_i$.

The phase entropy factor representing phase distribution of the diffracted orders $B_{\phi,\Delta\theta_i}^j$ of region i of the jth tile, can be computed in this embodiment as $$B_{\phi,\Delta\theta_i}^j = \int_{\theta \in \Delta\theta_i} \int_{\phi=0}^{2\pi} p_{\phi,\Delta\theta_i}^j(\phi) \log [p_{\phi,\Delta\theta_i}^j(\phi)] d\phi d\theta, \qquad \text{Eq. 12}$$

where $p_{\phi,\Delta\theta_i}^j(\phi)$ is a distribution function of phase values of the diffraction orders $a_j(u_x, u_y)$ within the angular region $\Delta\theta_i$.

The factor $E_T^j$ represents the total energy entropy of the diffracted orders $a_j(u_x, u_y)$ for tile j and can be computed in accordance with Eq. 6 above.

Figure 12:
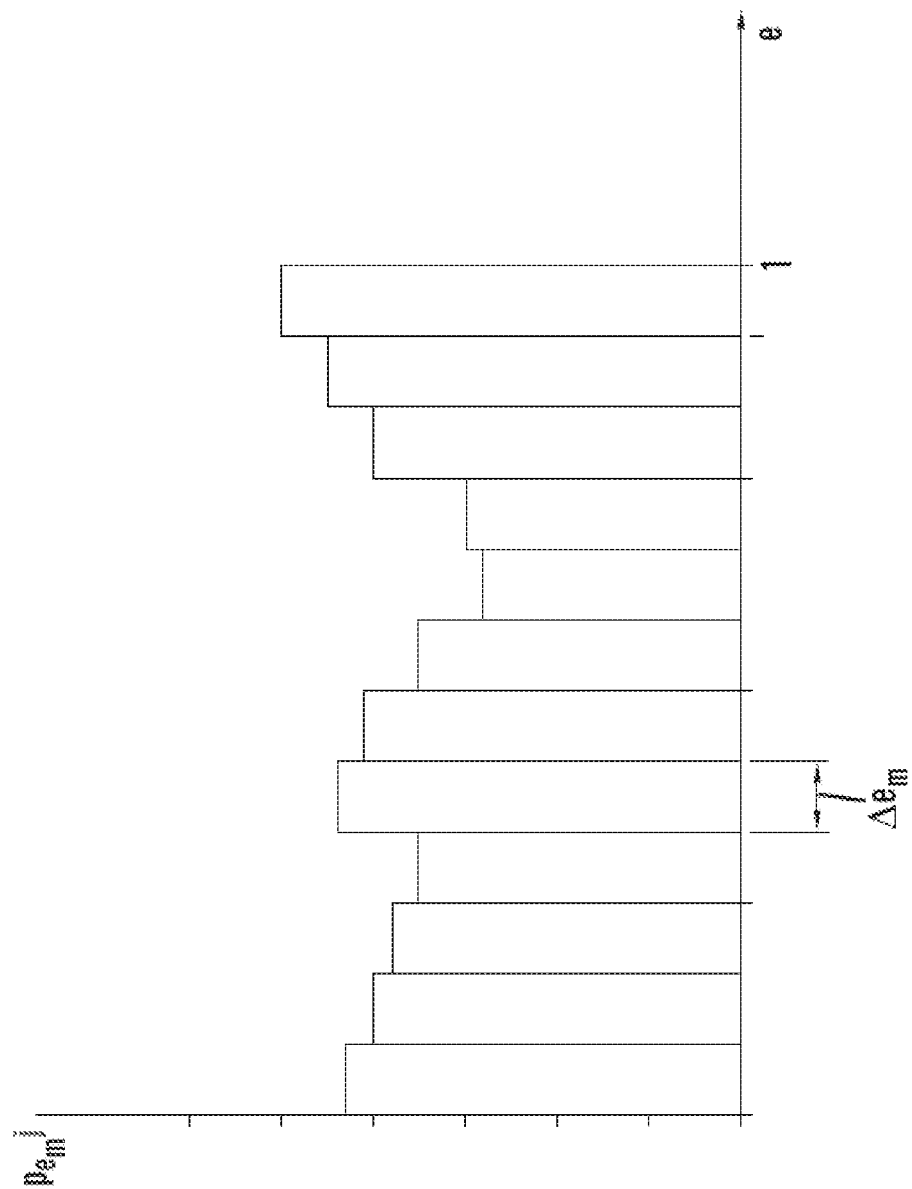
FIG. 12 illustrates a plot of a distribution function of energy values of diffraction orders.

The distribution functions $p_{e,i}^j(e)$, $p_{\phi,i}^j(\phi)$ and $p_e^j(e)$ may be computed as a function of values of e and $\phi$ of the diffracted orders $a_j(u_x, u_y)$. For example, the range of values of e within a given region $\Delta\theta_i$ of the unit circle can be divided into M bins each containing values of e in the range $\Delta e_m = e_m - e_{m-1}$, $m \in \{1, 2, \ldots, M\}$, as illustrated in FIG. 12. For a given region $\Delta\Theta_i$ of the unit circle, the number of occurrences of a given value of e of $a_j(u_x, u_y)$ are binned and the total number of occurrences are counted as $p_{e_m, \Delta\theta_i}^j(e_m)$. Similarly, the phase values $\phi$ of the diffracted orders $a_j(u_x, u_y)$ from 0° to 360° may be binned into N increments and the number of occurrences of a particular phase of the diffracted orders $a_j(u_x, u_y)$ within a region $\Delta\theta_i$ of the unit circle are counted as $p_{\phi_n, \Delta\theta_i}^j$, $n \in \{1, 2, \ldots, N\}$. The values of the distribution function of the total energy entropy $p_e^j(e)$ may be binned into L increments, and the number of occurrences of total energy entropy e of the diffracted orders $a_j(u_x, u_y)$ around the entire unit circle are counted as $p_{e_l}^j(e_l)$, $l \in \{1, 2, \ldots, L\}$.

Referring again to FIG. 4, each jth tile $P_j$ is assigned a global litho difficulty value $LD^j$ based on an evaluation of the litho difficulty metrics $LD_i^j$ for all the angular directions of the jth tile (Block 460). For example, in accordance with one embodiment, a global difficulty value $LD^j$ is assigned to the jth tile based on the worst case angular direction i, i.e.:

$$LD^j = \max_{1 \le i \le I_{max}} h_i LD_i^j, \qquad \text{Eq. 13}$$

where i is an index referring to a region of the unit circle in direction space, and $I_{max}$ is the number of regions that the unit circle is divided into. The constant $h_i$ is an empirically determined constant that can be used to take into account the relative importance of the region i, which may be due to the distribution of the illumination source in combination with the critical patterns to be printed.

Figure 13:
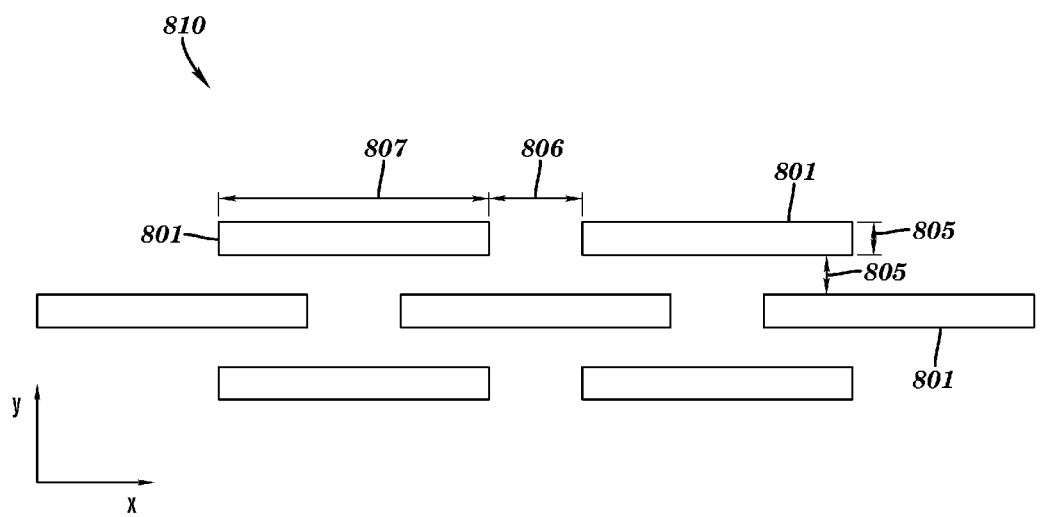
FIG. 13 illustrates a portion of a pattern of features to be printed.

For example, consider a portion 810 of a pattern of features to be printed as illustrated in FIG. 13. Features 801 are rectangular shapes having a length 807 and width 805, which typically may be equal to the CD for features such as conductive lines. The features 801 are spaced apart along the horizontal x direction by a space 806 that is typically larger than the CD 805. However, along the vertical y direction, the features 801 are spaced by a distance approximately equal to the CD 805, in order to maximize the density of the critical features 801. As can be seen in FIGS. 7A-7D, gratings having pitches along the horizontal x direction will tend to have diffraction orders tending to align along the $u_y$ axis in spatial frequency space. On the other hand, gratings having pitches oriented along the vertical y direction will tend to have diffraction orders aligned along the $u_x$ axis in spatial frequency space. Thus, it would be preferable to assign greater importance to litho difficulty metrics associated with the horizontally oriented angular directions in the example of FIG. 12 by assigning relatively smaller values of $h_i$ to be associated with the regions $\Delta\theta_1 = \{q: -45° < 0 \le 45°\}$, $\Delta\theta_3 = \{q: 135° < 0 \le 225°\}$ in the example illustrated in FIG. 6. Such a weighting which would tend to favor the expected higher values of the difficulty metric for the desirable CD spacing 805 of lines 801 along the vertical y direction.

Referring again to FIG. 4, next, a subset of the $P_j$ tiles is selected (Block 470) based on evaluation of the global litho difficulty metrics $LD^j$, for example, by ranking the tiles according to the value of $DL^j$, and selecting a set of tiles having the largest values of $LD^j$ for full optimization processing, such as SMO.

In another embodiment, a global litho difficulty metric for the jth tile may be expressed as:

$$\hat{LD}^j = (W_T^j)^{\alpha(\hat{A}^j)}[(\hat{B}_e^j \hat{B}_\phi^j E_T^j)^\beta]. \qquad \text{Eq. 14}$$

where the total energy of the diffracted orders $W_T^j$ may be obtained from Eq. 8, the total energy entropy factor $E_T$ may be obtained from Eq. 6, and $\hat{A}^j$, $\hat{B}_e^j$ and $\hat{B}_\phi^j$ are defined below.

In this embodiment, the energy ratio factor $\hat{A}^j$ is expressed as follows:

$$\hat{A}^j = \max_{1 \le i \le I_{max}} c_i A_i^j, \qquad \text{Eq. 15}$$

where i is an index referring to a region of the unit circle in direction space, and $I_{max}$ is the number of regions that the unit circle is divided into. The constant $c_i$ is an empirically determined constant that can be used to take into account the relative importance of the region i, which may be due to the distribution of the illumination source.

In this embodiment, the entropy factors $\hat{B}_e^j, \hat{B}_\phi^j$ may be determined from:

$$\hat{B}_e^j = \max_{1 \le i \le I_{max}} d_i B_{e,i}^j, \qquad \text{Eq. 16}$$

and $$\hat{B}_\phi^j = \max_{1 \le i \le I_{max}} g_i B_{\phi,i}^j. \qquad \text{Eq. 17}$$

where $d_i$ and $g_i$ are empirically determined constants that indicate the relative importance of each of the regions of the unit circle, based on the illumination source distribution.

Figure 14:
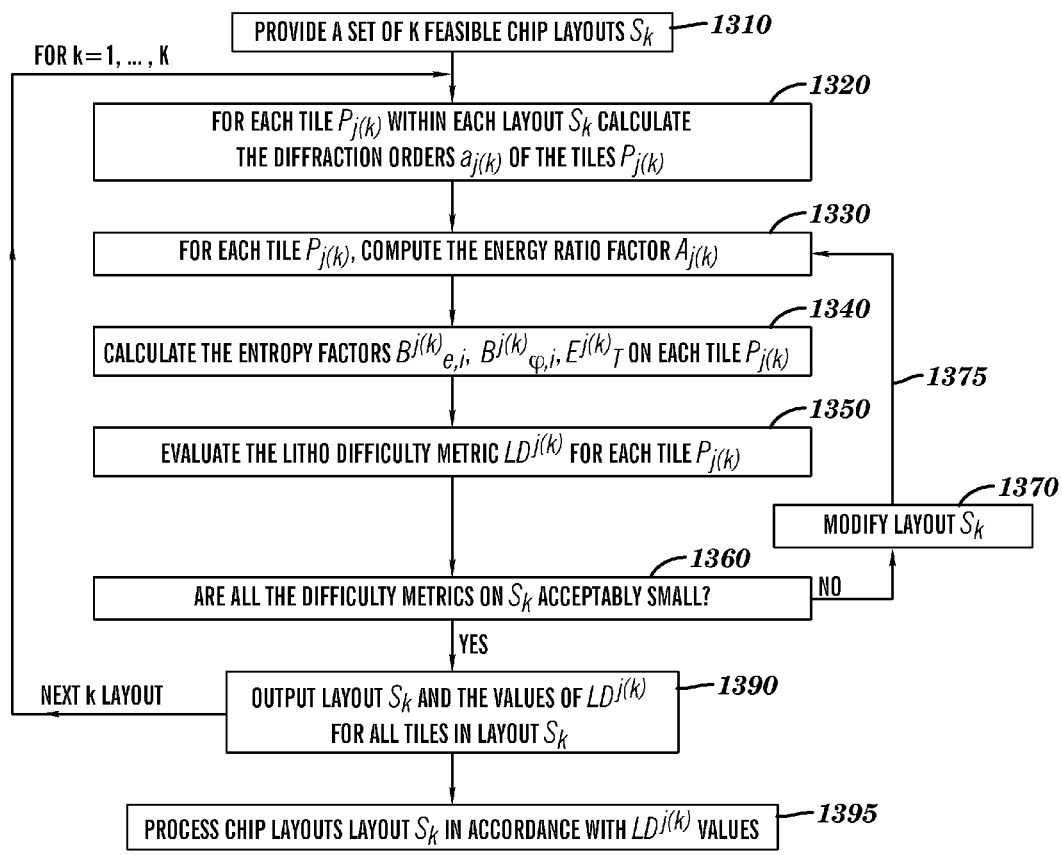
FIG. 14 illustrates an embodiment of a method in accordance with the invention.

Another embodiment is illustrated in FIG. 14. In accordance with the invention, during the design of a chip layout, several feasible chip layouts may be designed such that each of the feasible layouts have a litho difficulty metric that is less than a predetermined value, and thus be designed to be relatively easy to print. The chip layouts may be ranked in accordance with the litho difficulty metric. In accordance with one embodiment, only chip layouts that have a litho difficulty metric that is within a predetermined criterion are considered for the final chip design.

First, a set of K feasible chip layouts $S_k$, $k \in \{1, 2, \ldots, K\}$ are provided (Block 1310). Typically, a basic set of $J^D$ unique design tiles $P_j$, $j \in \{1, 2, \ldots, J^D\}$ is available to the designer, according to a set of predetermined design rules, for use in creating a chip layout. Each of the k layouts $S_k$ will include a subset $J^D(k)$ of the available of $J^D$ unique design tiles. For each layout $S_k$, the diffraction orders $a_{j(k)}$ are computed for each tile j(k), j(k)∈$\{1, 2, \ldots, J^D(k)\}$ used in each of the k layouts $S_k$ (Block 1320). Note that a particular tile $P_j$ may be used in more than one layout, and if so, the diffraction order $a_{j(k)}$ for that tile only needs to be computed once for all the layouts that contain that tile.

The amplitude factors $W_i^{j(k)}(r)$ and the energy ratio factors $A_i^{j(k)}$ are computed for each unique j(k)th tile in each chip layout $S_k$ (Block 1330). If these factors have previously been computed for the same tile in another of the K chip layouts, such computations need not be repeated.

The entropy factors $B_{e,i}^{j(k)}$, $B_{\varphi,i}^{j(k)}$, $E_T^{j(k)}$ are computed on each unique tile $P_{j(k)}$ in each set $S_k$ (Block 1340). If these factors have previously been computed for the same tile in another of the K chip layouts, such computations need not be repeated.

Then the lithographic difficulty metrics $LD^{j(k)}$ are computed for each unique tile $P_{j(k)}$ in each layout $S_k$ (Block 1350). The lithographic difficulty metric only needs to be computed once for each unique tile, and if it has been previously been computed for the same tile in another of the K chip layouts, such computations need not be repeated.

Next, for each layout $S_k$ the value of the litho difficulty metrics $LD^{j(k)}$ are compared to a predetermined threshold difficulty value $DT_k$ for layout $S_k$ (Block 1360). If, for all unique tiles $j(k) \in \{1, 2, \ldots, J(k)\}$, within layout $S_k$, $LD^{j(k)} \leq DT_k$, than the current kth layout is acceptable and the layout $S_k$ may be output (Block 1390) and the next layout may be evaluated. In addition, the values of the litho difficulty metric $LD^{j(k)}$ may be output for all the unique J(k) tiles within layout $S_k$.

If, for any layout $S_k$, $LD^{j(k)} \leq DT_k$, then not all of the tiles within the layout $S_k$ have an acceptable litho difficulty value, and the current kth layout is deemed not acceptable. If the layout is not deemed to have acceptably small litho difficulty metric values, then the layout $S_k$ is modified (Block 1370), for example, by replacing one or more tiles having unacceptably high litho difficulty values with other appropriate tiles, in accordance with the design rules. Then the energy ratio (Block 1330) and entropy factors (Block 1340) and litho difficulty metrics (Block 1350) are recomputed and evaluated until all the tiles within the layout $S_k$ satisfy the litho difficulty threshold $DT_k$ for that layout (Block 1360). Although unlikely, if no acceptable modification of the layout $S_k$ is found, for example, after a predetermined number of iterations, it may be necessary to reject that particular layout $S_k$, or add additional tiles to the available set of design rules.

Finally, the acceptable layout $S_k$ may be used in further design processes (Block 1395), such as MBOPC, OPC Verification and/or SMO, with potential cost savings in optimization since the acceptable layouts will have been pre-designed to be relatively easy to print.

Figure 15:
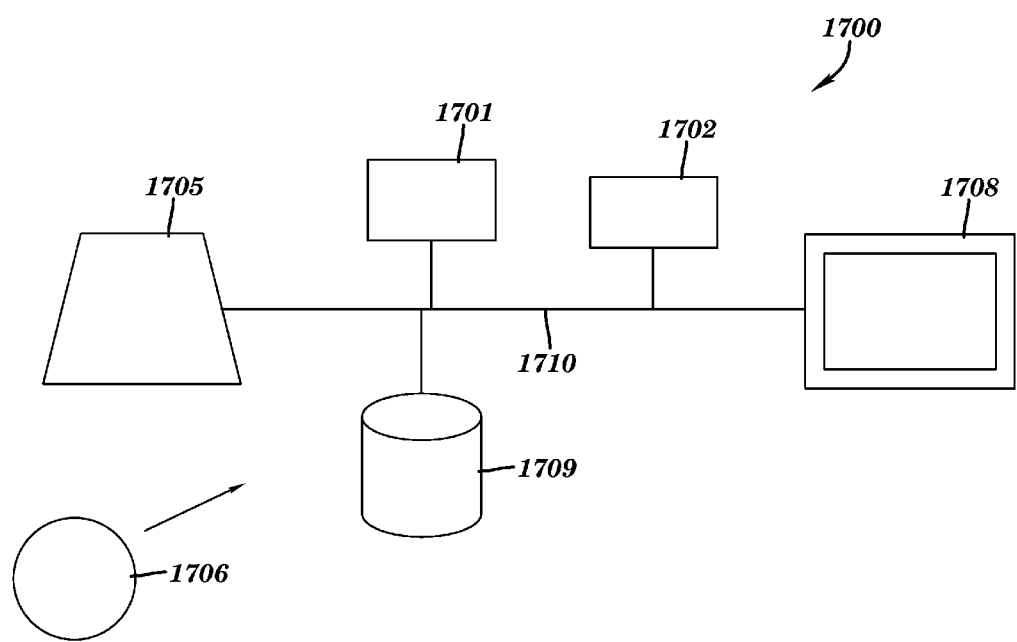
FIG. 15 illustrates an embodiment of a computer system and computer program product including instructions for performing method steps in accordance with the invention.

In one embodiment of the present invention, referring to FIG. 15, instructions for causing a computer or computer system to perform the method steps may be incorporated into a design tool implemented in a digital computer system 1700, having components including, but not limited to: a central processing unit (CPU) 1701, at least one input/output (I/O) device 1705 (such as a keyboard, a mouse, a compact disk (CD) drive, and the like), a display device 1708, a storage device 1709 capable of reading and/or writing computer readable code, and a memory 1702, all of which are connected, e.g., by a bus or a communications network 1710. The present invention may be implemented as a computer program product containing instructions stored on a computer readable medium, such as a tape or CD 1706, which may be, for example, read by the I/O device 1705, and stored in the storage device 1709 and/or the memory 1702. The computer program product contains instructions to cause a computer system to implement a method for designing a chip layout, including evaluation of a lithographic difficulty metric, in accordance with the present invention. The invention can take the form of an entirely hardware embodiment, and entirely software embodiment or an embodiment containing both hardware and software elements. In a preferred embodiment, the invention is implemented in a computer program product that contains instructions for executing method steps for designing a chip layout, including evaluation of a lithographic difficulty metric, executable by a computer, which includes, but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus, device or element that can contain or store the program for use by or in connection with the computer or instruction execution system. The medium can be an electronic, magnetic, optical, electromagnetic, infrared, or semiconductor storage medium. Examples of a storage medium include a semiconductor memory, fixed storage disk, moveable floppy disk, magnetic tape, and an optical disk. Current examples of optical disks include compact disk-read only memory (CD-ROM), compact disk-read/write (CD-R/W) and digital video disk (DVD).

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of designing an integrated circuit layout, comprising:
   providing a plurality of layouts of features to be printed;
   determining, employing a computer or computer system, the diffraction orders in spatial frequency space for each of said plurality of layouts;
   providing, employing said computer or computer system, a lithographic difficulty metric comprising a function of:
   an energy ratio factor comprising a ratio of hard-to-print energy to easy-to-print energy of said diffraction orders along an angular coordinate $\theta_i$ of said spatial frequency space, wherein said hard-to-print energy comprises energy of said diffraction orders at values of the normalized radial coordinates r of said spatial frequency space in a neighborhood of r=0 and in a neighborhood of r=1, and said easy-to-print energy comprises energy of said diffraction orders located at intermediate values of said normalized radial coordinates r between said neighborhood of r=0 and said neighborhood of r=1;
   an energy entropy factor comprising energy entropy of said diffraction orders along said angular coordinate $\theta_i$;
   a phase entropy factor comprising phase entropy of said diffraction orders along said angular coordinate $\theta_i$; and
   a total energy entropy factor comprising total energy entropy of said diffraction orders;
   computing, for each of said plurality of layouts, employing said computer or computer system, values of said lithographic difficulty metric; and evaluating each of said plurality of layouts based on said values of said lithographic difficulty metric.

2. The method of claim 1, further comprising performing full optimization processing on each of said plurality of layouts having a value of said lithographic difficulty metric that is greater than a predetermined lithographic difficulty threshold.

3. The method of claim 1, wherein said plurality of layouts comprises a set of unique tiles of patterns of features such that a full chip layout consists of an arrangement of a plurality of tiles selected from said set of unique tiles.

4. The method of claim 3, wherein said predetermined lithographic difficulty threshold is set to identify which of said unique tiles in said set of unique tiles are binding patterns of said full chip layout.

5. The method of claim 1, wherein said computed values of said lithographic difficulty metric are computed at selected values of said angular coordinate $\theta_i$, and said method further comprises determining a global lithographic difficulty metric for each of said plurality of layouts, said global lithographic difficulty metric comprising a maximum value of said lithographic difficulty metrics from among said selected values of said angular coordinate $\theta_i$.

6. The method of claim 1, further comprising, for each of said plurality of layouts:
computing a global energy ratio factor comprising a maximum value of said ratio of hard-to-print energy to easy-to-print energy values computed at selected values of said angular coordinate $\theta_i$;
computing a global energy entropy factor comprising a maximum value of said energy entropy values computed at selected values of said angular coordinate $\theta_i$;
computing a global phase entropy factor comprising a maximum value of said phase entropy values computed at selected values of said angular coordinate $\theta_i$; and
computing said energy entropy factor; and
computing a global lithographic difficulty metric value, said global lithographic difficulty metric value comprising a comprising a function of said computed global energy ratio factor, said computed a global energy entropy factor, said computed global phase entropy factor and said computed energy entropy factor.

7. The method of claim 1, wherein said spatial frequency space is subdivided into radial regions, each radial region comprising a range of angular coordinates, and said method further comprises computing a regional value of said energy ratio factor, said energy entropy factor and said phase entropy factor for each of said radial regions.

8. The method of claim 1, further comprising weighting said energy ratio factor, said energy entropy factor, said phase entropy factor and said lithographic difficulty metric according to a relative importance of said angular coordinate $\theta_i$.

9. The method of claim 8, wherein said weighting is based on a distribution of an illumination source.

10. A method of designing an integrated circuit layout, comprising:
providing a set of design tiles to a computer or computer system, wherein each of said design tiles in said set comprises a unique layout of patterns of features to be printed;
providing a plurality of chip layouts to said computer or computer system, wherein each of said chip layouts consists of an arrangement of tiles selected from said set of design tiles;
providing, employing said computer or computer system, a lithographic difficulty metric comprising a function of:
an energy ratio factor comprising a ratio of hard-to-print energy to easy-to-print energy of diffraction orders along an angular coordinate of $\theta_i$ of spatial frequency space for each of said plurality of chip layouts, wherein said hard-to-print energy comprises energy of said diffraction orders at values of the normalized radial coordinates r of said spatial frequency space in a neighborhood of r=0 and in a neighborhood of r=1, and said easy-to-print energy comprises energy of said diffraction orders located at intermediate values of said normalized radial coordinates r between said neighborhood of r=0 and said neighborhood of r=1;
an energy entropy factor comprising energy entropy of said diffraction orders along said angular coordinate $\theta_i$;
a phase entropy factor comprising phase entropy of said diffraction orders along said angular coordinate $\theta_i$; and
a total energy entropy factor comprising total energy entropy of said diffraction orders; and
for each of said chip layouts, performing, employing said computer or computer system, the method steps of:
determining the diffraction orders in spatial frequency space for each unique tile in said arrangement of tiles;
computing, for each of said unique tiles in said arrangement of tiles, values of said lithographic difficulty metric; and
evaluating each of said unique tiles based on said values of said lithographic difficulty metric.

11. The method of claim 10, further comprising modifying one of said chip layouts if one of said values of said lithographic difficulty metric associated with one of said unique tiles in said arrangement of tiles is greater than a predetermined lithographic difficulty threshold.

12. A computer program product comprising a non-transitory computer useable medium having stored therein computer readable instructions, wherein the computer readable instructions when executed on a computer causethe computer to perform the method steps of:
providing a plurality of layouts of features to be printed;
determining the diffraction orders in spatial frequency space for each of said plurality of layouts;
providing a lithographic difficulty metric comprising a function of:
an energy ratio factor comprising a ratio of hard-to-print energy to easy-to-print energy of said diffraction orders along an angular coordinate $\theta_i$ of said spatial frequency space, wherein said hard-to-print energy comprises energy of said diffraction orders at values of the normalized radial coordinates r of said spatial frequency space in a neighborhood of r=0 and in a neighborhood of r=1, and said easy-to-print energy comprises energy of said diffraction orders located at intermediate values of said normalized radial coordinates r between said neighborhood of r=0 and said neighborhood of r=1;
an energy entropy factor comprising energy entropy of said diffraction orders along said angular coordinate $\theta_i$;
a phase entropy factor comprising phase entropy of said diffraction orders along said angular coordinate $\theta_i$; and
a total energy entropy factor comprising total energy entropy of said diffraction orders;
computing, for each of said plurality of layouts, values of said lithographic difficulty metric; and evaluating each of said plurality of layouts based on said values of said lithographic difficulty metric.

13. The computer program product of claim 12, said method steps further comprising performing full optimization processing on each of said plurality of layouts having a value of said lithographic difficulty metric that is greater than a predetermined lithographic difficulty threshold.

14. The computer program product of claim 12, wherein said plurality of layouts comprises a set of unique tiles of patterns of features such that a full chip layout consists of an arrangement of a plurality of tiles selected from said set of unique tiles.

15. The computer program product of claim 14, wherein said predetermined lithographic difficulty threshold is set to identify which of said unique tiles in said set of unique tiles are binding patterns of said full chip layout.

16. The computer program product of claim 12, wherein said computed values of said lithographic difficulty metric are computed at selected values of said angular coordinate $\theta_i$, and said method steps further comprising determining a global lithographic difficulty metric for each of said plurality of layouts, said global lithographic difficulty metric comprising a maximum value of said lithographic difficulty metrics from among said selected values of said angular coordinate $\theta_i$.

17. The computer program product of claim 12, said method steps further comprising, for each of said plurality of layouts:
computing a global energy ratio factor comprising a maximum value of said ratio of hard-to-print energy to easy-to-print energy values computed at selected values of said angular coordinate $\theta_i$;
computing a global energy entropy factor comprising a maximum value of said energy entropy values computed at selected values of said angular coordinate $\theta_i$;
computing a global phase entropy factor comprising a maximum value of said phase entropy values computed at selected values of said angular coordinate $\theta_i$; and
computing said energy entropy factor; and
computing a global lithographic difficulty metric value, said global lithographic difficulty metric value comprising a comprising a function of said computed global energy ratio factor, said computed a global energy entropy factor, said computed global phase entropy factor and said computed energy entropy factor.

18. The computer program product of claim 12, wherein said spatial frequency space is subdivided into radial regions, each radial region comprising a range of angular coordinates, and said method steps further comprising computing a regional value of said energy ratio factor, said energy entropy factor and said phase entropy factor for each of said radial regions.

19. The computer program product of claim 12, said method steps further comprising weighting said energy ratio factor, said energy entropy factor, said phase entropy factor and said lithographic difficulty metric according to a relative importance of said angular coordinate $\theta_i$.

20. The computer program product of claim 19, wherein said weighting is based on a distribution of an illumination source.

21. A computer system for designing an integrated circuit layout, the computer system comprising a storage device having stored therein computer readable instructions, wherein the computer readable instructions when executed on the computer system causes the computer system to perform a method comprising the steps of:
providing a plurality of layouts of features to be printed;
determining the diffraction orders in spatial frequency space for each of said plurality of layouts;
providing a lithographic difficulty metric comprising a function of:
an energy ratio factor comprising a ratio of hard-to-print energy to easy-to-print energy of said diffraction orders along an angular coordinate $\theta_i$ of a of said spatial frequency space, wherein said hard-to-print energy comprises energy of said diffraction orders at values of the normalized radial coordinates r of said spatial frequency space in a neighborhood of r=0 and in a neighborhood of r=1, and said easy-to-print energy comprises energy of said diffraction orders located at intermediate values of said normalized radial coordinates r between said neighborhood of r=0 and said neighborhood of r=1;
an energy entropy factor comprising energy entropy of said diffraction orders along said angular coordinate $\theta_i$;
a phase entropy factor comprising phase entropy of said diffraction orders along said angular coordinate $\theta_i$; and
a total energy entropy factor comprising total energy entropy of said diffraction orders;
computing, for each of said plurality of layouts, values of said lithographic difficulty metric; and
evaluating each of said plurality of layouts based on said values of said lithographic difficulty metric.

22. The computer system of claim 21, said method further comprising the step of performing full optimization processing on each of said plurality of layouts having a value of said lithographic difficulty metric that is greater than a predetermined lithographic difficulty threshold.

23. The computer system of claim 21, wherein said plurality of layouts comprises a set of unique tiles of patterns of features such that a full chip layout consists of an arrangement of a plurality of tiles selected from said set of unique tiles.

24. The computer system of claim 23, wherein said predetermined lithographic difficulty threshold is set to identify which of said unique tiles in said set of unique tiles are binding patterns of said full chip layout.

25. The computer system of claim 21, wherein said computed values of said lithographic difficulty metric are computed at selected values of said angular coordinate $\theta_i$, and said method further comprises the step of determining a global lithographic difficulty metric for each of said plurality of layouts, said global lithographic difficulty metric comprising a maximum value of said lithographic difficulty metrics from among said selected values of said angular coordinate $\theta_i$.

* * * * *